United States Patent [19]
Chun et al.

[11] Patent Number: 5,864,642
[45] Date of Patent: Jan. 26, 1999

[54] ELECTRO-OPTIC DEVICE BOARD

[75] Inventors: Christopher K. Y. Chun, Gilbert; Daniel B. Schwartz, Apache Junction; Melissa Denvir, Mesa; George Edward Charles, Chandler, all of Ariz.; Dale Brian Halling, Colorado Springs, Colo.

[73] Assignee: Motorola, Inc., Schaumburg, Ill.

[21] Appl. No.: 797,441

[22] Filed: Feb. 10, 1997

[51] Int. Cl.⁶ .................................................. G02B 6/122
[52] U.S. Cl. ................................ 385/14; 385/15; 385/50
[58] Field of Search ................................ 385/14, 15, 24, 385/27, 31, 34, 36, 37, 39, 47, 48, 50, 88, 89

[56] References Cited

U.S. PATENT DOCUMENTS

| | | | |
|---|---|---|---|
| 4,732,446 | 3/1988 | Gipson et al. | 385/24 |
| 4,758,063 | 7/1988 | Konechny, Jr. | 385/53 |
| 5,011,249 | 4/1991 | Diaz | 385/14 |
| 5,170,448 | 12/1992 | Ackley et al. | 385/31 |
| 5,208,879 | 5/1993 | Gallo et al. | 385/14 |
| 5,408,109 | 4/1995 | Heeger et al. | 257/40 |
| 5,409,981 | 4/1995 | Kadooka et al. | 524/413 |
| 5,454,880 | 10/1995 | Sariciftci et al. | 136/263 |
| 5,463,229 | 10/1995 | Takase et al. | 257/59 |

OTHER PUBLICATIONS

"Electro–Optical Board Technology Based on Discrete Wiring" by W. Delbar et al., pp. 604–613 [No Journal Name or Date].

*Primary Examiner*—John D. Lee
*Attorney, Agent, or Firm*—William E. Koch

[57] ABSTRACT

A flexible electro-optic circuit board (20) includes a polymer circuit board (22) and a polymer optical backplane (34). The polymer circuit board (22) includes a plurality of circuit elements (50, 52). The polymer optical backplane (34) has a plurality of optical transmission lines (44). A plurality of optical vias (30) couple the polymer circuit board (22) to the polymer optical backplane (34).

14 Claims, 3 Drawing Sheets

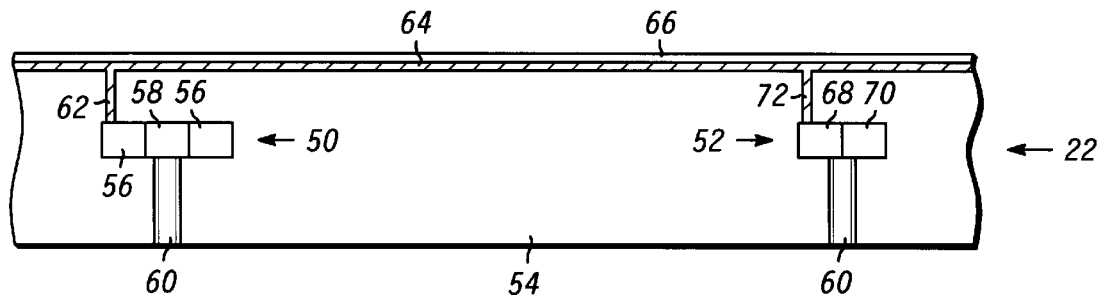
FIG. 3
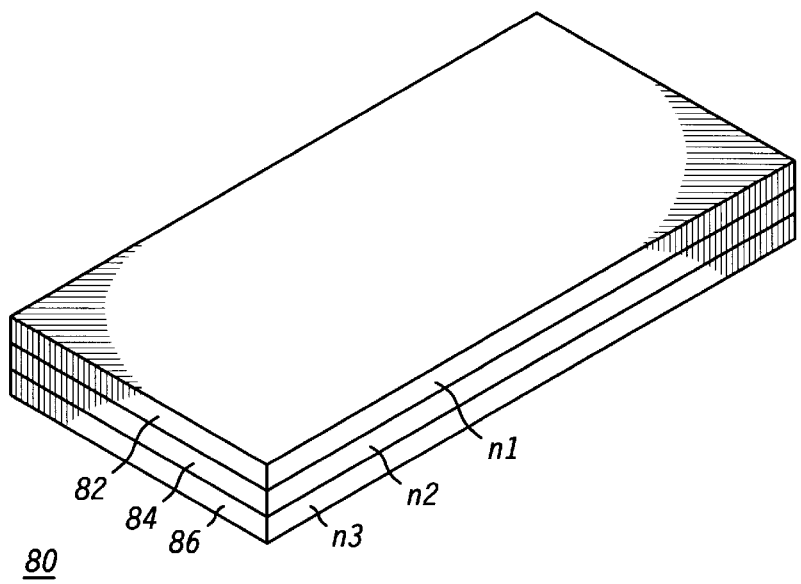
FIG. 4
FIG. 5
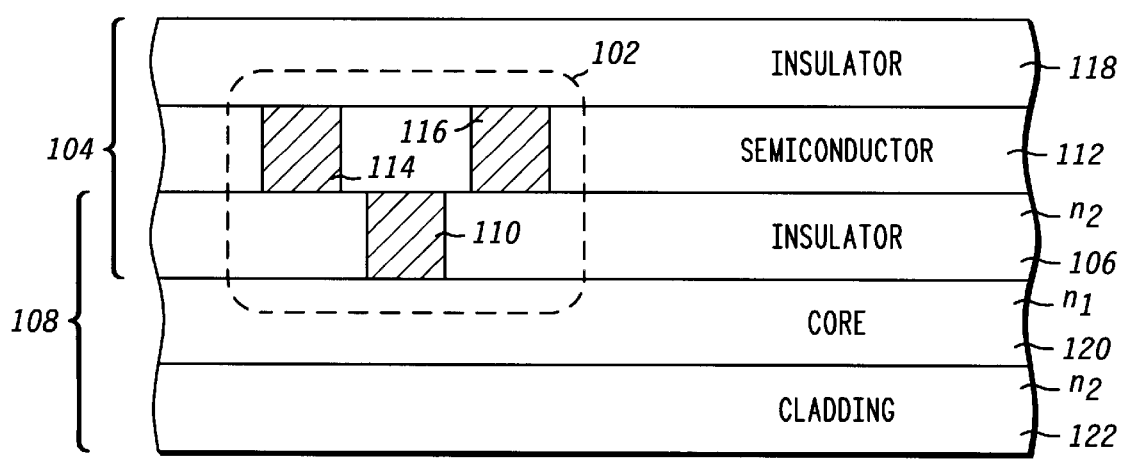

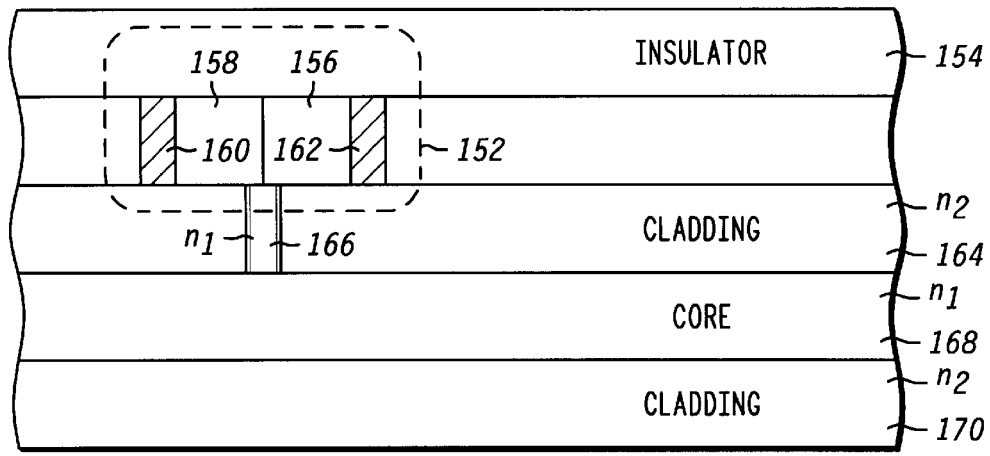
FIG. 6  *150*
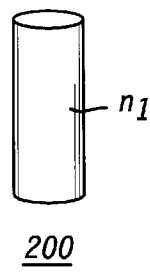
*200*
FIG. 7
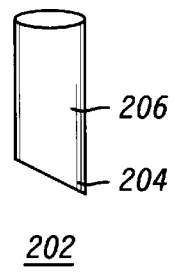
*202*
FIG. 8
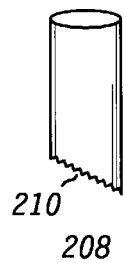
*208*
FIG. 9
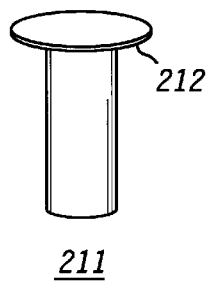
*211*
FIG. 10
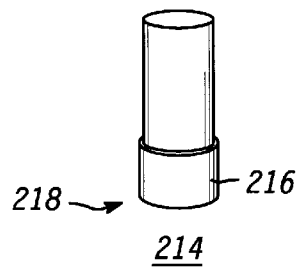
*214*
FIG. 11
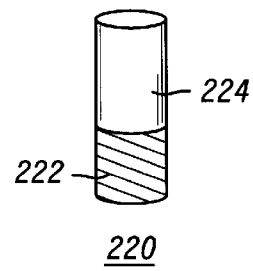
*220*
FIG. 12
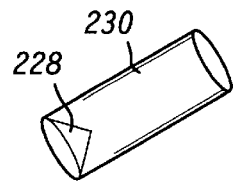
*226*
FIG. 13

ELECTRO-OPTIC DEVICE BOARD

FIELD OF THE INVENTION

The present invention relates generally to the field of electro-optics and more particularly to an electro-optic circuit board.

BACKGROUND OF THE INVENTION

The invention of the laser held the promised of virtually unlimited bandwidth for communications and electronic applications. Two obstacles had to be overcome to unleash the promise of the laser. First, lasers had to be formed out of semiconductor materials to be compatible with modern electronic devices. Second, an optical waveguide for channeling and directing the laser light was required. Fiber optic cables and semiconductor lasers have overcome these obstacles allowing large bandwidth communication systems to be built. However, in present electro-optic systems there is a distinct dividing line between the electronic and the optical parts of the system leading to a problem in developing fully integrated electro-optical systems. One of the obstacles to achieving greater integration is a lack of a suitable device that is compatible with both electrical and optical signals.

Thus, there exists a need for an electro-optic device that is more compatible with both electrical and optical signals.

BRIEF DESCRIPTION OF THE DRAWINGS

FIG. 3 is a cross section of a flexible circuit board;

FIG. 4 is a perspective view of an embodiment of an optical plane;

FIG. 5 is a cross section of another embodiment of an electro-optic circuit board;

FIG. 6 is a cross section of another embodiment of an electro-optic circuit board; and FIGS. 7–13 are alternative embodiments of an optical via.

DETAILED DESCRIPTION OF THE DRAWINGS

In summary the invention provides an electro-optic device including a polymer circuit board, a polymer optical backplane, and a plurality of optical vias connecting the circuit board and the optical backplane. The electro-optic circuit board is flexible, which allows it meet a variety of form factors.

Figure 1:
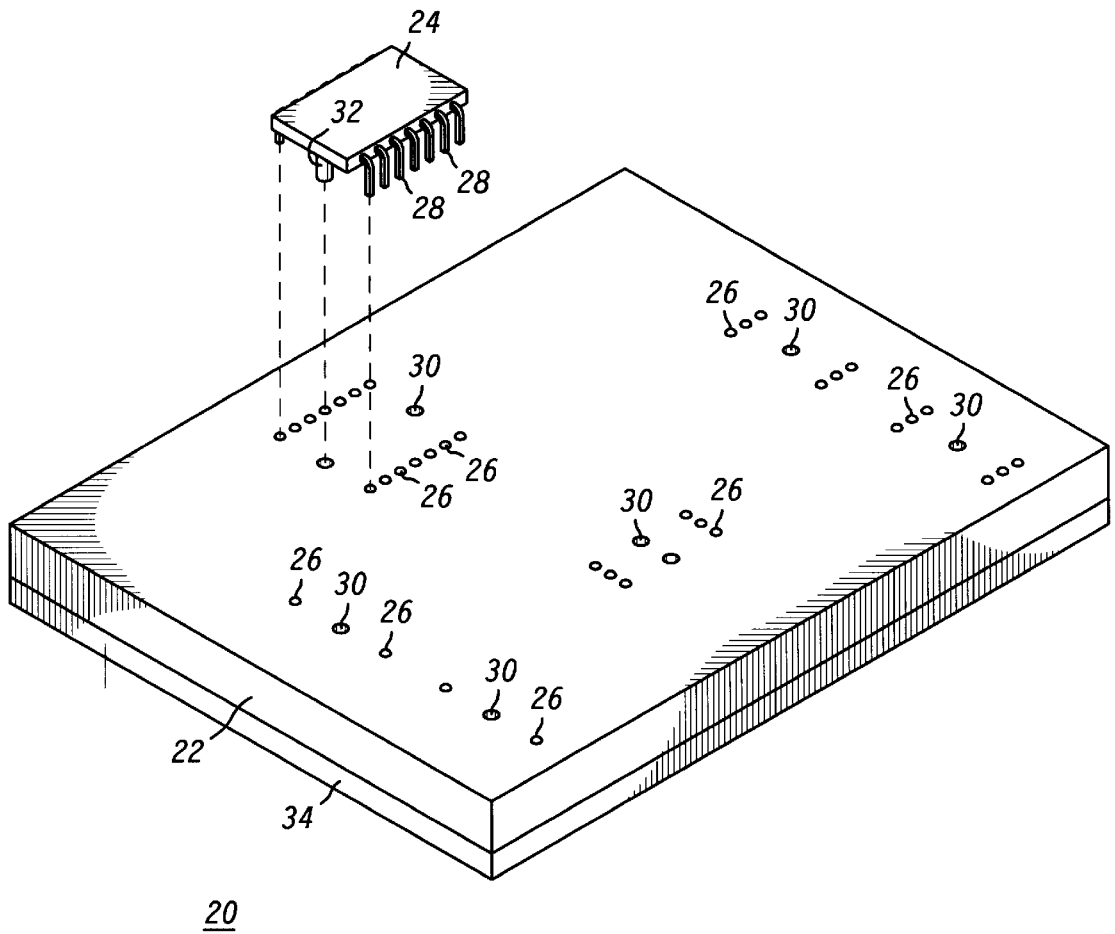
FIG. 1 is a perspective view of an embodiment of an electro-optic circuit board.

FIG. 1 is a perspective view of an embodiment of an electro-optic device 20. The electro-optic device 20 includes a flexible polymer electrical circuit board 22 for receiving electro-optic components 24 and a polymer optical backplane 34. The electrical circuit board 22 has a plurality of electrical pads (or sockets) 26 for receiving a plurality of electrical pins (pads) 28 on the electro-optic component 24. A plurality of optical vias, also referred to as sockets, 30 are provided in the electrical circuit board 22. The sockets 30 receive optical pins 32 of the electro-optic components 24. The sockets 30 provide access to the flexible polymer optical backplane 34. The polymer optical backplane 34 has a plurality of optical transmission lines for carrying a plurality of optical signals. The polymer used for the circuit board 22 and for the backplane 34 is any suitable polymer material such as those described in U.S. Pat. No. 5,454,880.

Figure 2:
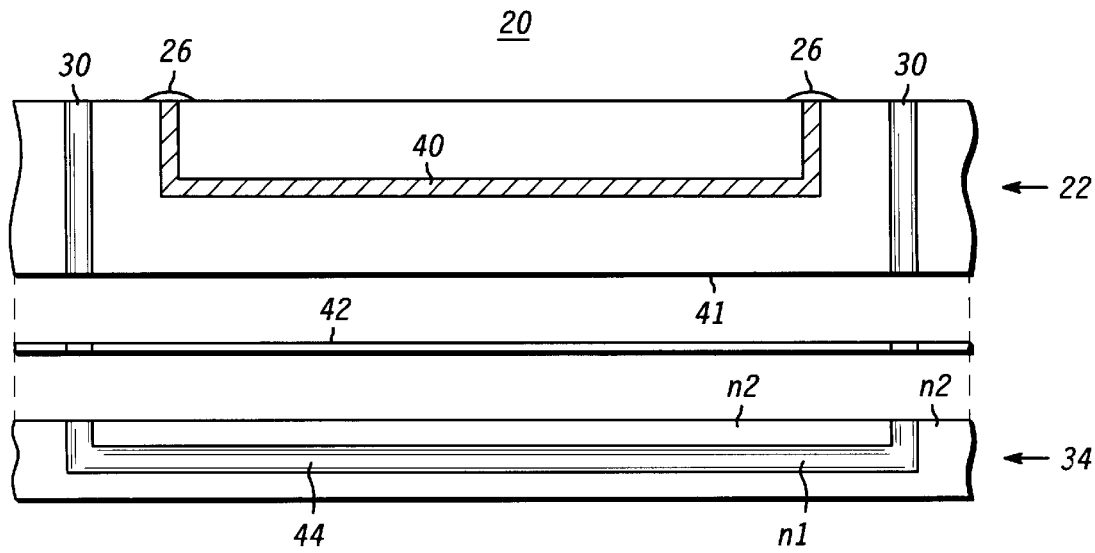
FIG. 2 is an exploded cross section of the electro-optic circuit board of FIG. 1.

FIG. 2 is an exploded cross section view of the electro-optic circuit board 20. The polymer circuit board 22 has an electrical conductor 40 connecting a pair of electrical pads 26. The electrical conductor 40 can be formed by laminating a strip of metal conductor between layers of the polymer. In another embodiment a conductive polymer can be placed in an etched line in the insulting polymer. The conductive polymer can be formed by placing a concentration of conductive particulates in a polymer. The conductive particulates can be a metal or carbon. In yet another embodiment the electrical conductor can be formed by ion bombardment. The optical socket 30 is formed in the polymer circuit board 22 by etching or drilling a hole through the polymer material.

The flexible electric circuit board 22 has a first surface 41 that is bonded to the polymer optical backplane 34 by an adhesive 42 in one embodiment. An optical transmission line or a plurality of optical transmission lines 44 is formed in the polymer optical backplane 34. The optical transmission line connects a pair of optical sockets 30. The optical transmission line 44 uses internal reflection created by a difference in the indices of refraction (n1 and n2) within the backplane 34 to contain the light. A line of a first index of refraction material is surrounded by a second index of refraction material. The index of refraction of the polymer can be changed by adding doping materials or by stressing the polymer with an electronic beam for instance.

FIG. 3 is a cross section of an embodiment of the polymer circuit board 22 containing a plurality of circuit elements 50, 52. The circuit elements 50, 52 are surrounded by an insulating polymer 54. One of the plurality of circuit elements is shown as a photo-transistor 50. The photo-transistor 50 is made of p-type semiconductor material (first type of polymer semiconductor) 56 and n-type semiconducting material (second type of polymer semiconductor) 58. (Note that the transistor could also be a npn transistor) An optical via 60 provides access from the photo-transistor 50 to the optical backplane. An electrical trace 62 provides access from an electrical conductor 64 to the transistor 50. Other electrical traces connecting to the transistor 50 are not shown because they are in a different plane than the cross section shown in FIG. 3. The electrical conductor 64 is covered with an insulting layer of polymer 66. The other exemplary circuit element is a laser diode 52 or any suitable light emitting device such as a light emitting diode. The laser diode 52 is formed of a p-type material 68 and a n-type material 70. An electrical trace 72 is shown connected to the p-type material 68. Other similar electrical traces connecting to the n type material 70 of the laser diode 52 are preferably in another plane and therefore are not shown. The laser diode 52 is connected by the optical via 60 to the optical backplane 34. The optical via 60 can be a hole in the polymer 54 or can be a rod of polymer having the same index of refraction as the core material of an optical transmission line (optical plane).

FIG. 4 shows an embodiment of an optical plane 80. The optical plane 80 has a first layer 82 having a first index of refraction ($n_1$), a second layer 84 having a second index of refraction ($n_2$), and a third layer 86 having a third index of refraction ($n_3$). Generally, the first and third index of refraction are substantially equal and less than the second index of refraction. As a result light entering the second layer 84 is trapped in the plane formed by the second layer 84. The plane 80 provides a limited broadcast capability. In one embodiment, optical signals in the optical plane are identified by headers. The headers contain information on the destination and source of the optical signal. When an optical signal is received, a receiver checks the destination code. When the destination code matches the receiver's destination code, the optical signal is decoded. When the destination code does not match the signal is disregarded. Since, the optical plane 80 is made out of a polymer it is flexible and the "plane" is not always a geometric plane.

Another embodiment of a flexible electro-optic circuit board 100 is shown in FIG. 5. In this embodiment an FET type of transistor 102 is formed in a polymer electrical circuit board 104. This embodiment also shows how one layer (adjacent layer) 106 can be shared between the polymer electrical circuit board 104 and the polymer optical plane 108. The FET transistor 102 is formed by creating a first conductive trace 110 in a first insulating layer 106 of the polymer. The trace 110 is the gate of the FET 102. A semiconducting layer (second layer) 112 of the polymer (polymer semiconductor) is placed adjacent to the first layer 106. A pair of conductive traces (second conductive trace) 114, 116 are formed on either side of the gate trace 110. The pair of conductive traces forms the drain and source of the FET transistor 102. A second insulating layer 118 of the polymer is placed over the second layer 112. The first layer 106 has a second index of refraction and forms a cladding like layer for an optical plane or optical transmission line. Adjacent the layer 106 is a transmission layer 120 having at least a portion thereof with a first index of refraction. A cladding layer 122 is formed over the transmission layer 120.

The electro-optic circuit board 150 of FIG. 6 is similar to the electro-optic circuit board 100 of FIG. 5, except the FET transistor 102 is replaced with a photodiode 152. An electrically insulating layer 154 is placed over the photo-diode 152. The photo-diode 152 is made by impregnating a polymer with the appropriate dopant to form p-type material 156 and n-type material 158. A pair of electrical traces 160, 162 provide electrical access to the photo-diode 152. An adjacent layer 164 is formed of an electrically insulating polymer having a second index of refraction. An optical via 166 is formed in the adjacent layer 164 by placing a rod of first index of refraction material through the adjacent layer 164. A core 168 of an optical transmission line is coupled to the optical via 166. The core 168 has a first index of refraction. A cladding 170 is placed over the core layer 168. The cladding 170 has a second index of refraction.

An important feature of the electro-optic circuit board is the optical via. FIGS. 7–13 show a number of different optical vias. The optical via insures good coupling between the optical transmission line (optical plane) and the electro-optic component in the electrical circuit board. Generally, an optical via has a tip that extends into the core material to provide good coupling. In other embodiments the tip is placed in contact with the edge of the core material. An optical via 200 of FIG. 7 is a rod of material, such as a polymer, having the same index of refraction as the core of an optical transmission line. Since, the optical via has the same index of refraction as the core, a significant portion of the light traveling along the optical transmission line will be coupled into (or out of) the optical transmission line. The embodiment of the optical via 202 of FIG. 8 has a wedge (angled reflector) 204 at a tip 206 of the optical via. The wedge (prism) 204 directs the light into and out of the optical transmission line and increases the coupling between the optical transmission line and the electro-optic component. The coupling can be further increased by placing a reflective material on the wedge. The embodiment in FIG. 9 has a diffraction grating 210 that selects a particular wavelength of light which allows the optical via 208 to be part of a wavelength division multiplexed optical transmission line. The embodiment in FIG. 10 is similar to the optical via in FIG. 7 but has a filter 212 at an input-output of the optical via to select a particular wavelength (first frequency) optical signal. In the embodiment of FIG. 11 of the optical via 214 has an optical filter 216 placed around a tip 218 of the optical via 214. The optical filter 216 selects a particular wavelength. This optical via 214 is designed to work with the optical plane 80 and allows optical signals to be selected by their wavelength. In another embodiment, the optical filter is replaced with a holographic element 216. The holographic imaging element 216 can provide both wavelength selection and focusing of the light into and out of the optical via 214. The embodiment of the optical via 220 shown in FIG. 12 has a Bragg grating 222 formed by a sinusoidally varying index of refraction at the tip 224 of the optical via 220. The Bragg grating 222 selects a particular wavelength for coupling into and out of the optical via 220, while other wavelength signals pass right through the grating 222. Note this is also true of the holographic element 216. FIG. 13 shows an optical via 226 with a circular pyramidal reflector 228 at its tip 230. Optical via 226 is designed to work with the optical plane 80 and provides a broadcast pattern to light injected into the optical plane 80 and also allows omnidirectional coupling of incoming signals. All of the optical vias in FIGS. 7–13 can be made of polymer material and therefor preserve the flexibility of an electro-optic circuit board.

Thus there has been described an electro-optic circuit board (integrated circuit) that is compatible with both electrical and optical signals. While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. An electro-optic circuit board comprising:

a flexible electrical circuit board having a plurality of electrical conductors, the flexible circuit board having a first major surface, and a second opposed major surface and a plurality of sockets extending therethrough from the first major surface to the second major surface;

a flexible optical plane attached in parallel juxtaposition to the first surface of the flexible electrical circuit board, the optical plane further including a plurality of optical transmission lines and a plurality of socket extensions extending partially through the optical plane and optically coupled to the optical transmission lines, the plurality of socket extensions being axially aligned, one each, with the plurality of sockets in the electrical circuit board; and a plurality of electro-optic devices each including a plurality of electrical terminals and an optical port, each of the electro-optic devices further including an associated optical pin extending outwardly therefrom and in optical communication with the optical port, the plurality of electro-optic devices being mounted on the second surface of the flexible electrical circuit board with the plurality of electrical terminals coupled to the plurality of electrical conductors and the associated optical pin inserted in a socket and aligned socket extension so that the optical port is in communication with at least one optical transmission line.

2. The electro-optic circuit board of claim 1, wherein the flexible optical plane comprises a first layer having a first index of refraction, and a second layer having a second index of refraction.

3. The electro-optic circuit board of claim 2, wherein the optical plane further comprises a third layer having a third index of refraction.

4. The electro-optic circuit board of claim 3, wherein each of the plurality of optical pins has a tip extended into the flexible optical plane, the tip having a circular pyramid reflector.

5. The electro-optic circuit board of claim 3, wherein each of the plurality of optical pins has a tip extended into the flexible optical plane, the tip having a holographic imaging element.

6. The electro-optic circuit board of claim 2, wherein the plurality of optical pins carry a plurality of optical signals.

7. The electro-optic circuit board of claim 6, wherein each of the plurality of optical pins has a filter.

8. The electro-optic circuit board of claim 6, wherein each of the plurality of optical pins has a tip extending into the optical plane, the tip having a holographic element that selects optical signals having a desired frequency.

9. The electro-optic circuit board of claim 1, wherein the flexible electrical circuit board has a semiconducting layer on which a plurality of semiconducting devices are formed.

10. An electro-optic circuit board comprising:

a polymer electrical circuit board having a first surface, an opposed second surface, and a plurality of electrical conductors;

a polymer optical plane attached to the first surface of the polymer electrical circuit board;

a plurality of electro-optic devices mounted on the second surface of the electrical circuit board, each electro-optic device having a plurality of electrical terminals coupled to the electrical conductors of the electrical circuit board and an optical port; and a plurality of optical vias connecting the optical port of each of the plurality of electro-optic devices on the polymer electrical circuit board to the polymer optical plane.

11. The electro-optic circuit board of claim 10, wherein the optical plane has a plurality of optical transmission lines.

12. The electro-optic circuit board of claim 11, wherein one of the plurality of optical vias is connected to one of the plurality of optical transmission lines.

13. The electro-optic circuit board of claim 11, wherein one of the plurality of vias has a tip extended into one of the plurality of optical transmission lines and the tip includes a prism.

14. The electro-optic circuit board of claim 11, wherein one of the plurality of vias has a tip extended into one of the plurality of optical transmission lines and the tip includes a holographic element.

* * * * *